United States Patent [19]

Shizu

[11] Patent Number: 5,073,727

[45] Date of Patent: Dec. 17, 1991

[54] CMOS INVERTER WITH NOISE REDUCTION FEEDBACK MEANS

[76] Inventor: Harumi Shizu, 1-130-1-102, Mizuhodori, Kasugai-shi, Aichi, 486, Japan

[21] Appl. No.: 356,920

[22] Filed: May 25, 1989

[30] Foreign Application Priority Data

Jun. 17, 1988 [JP] Japan .................. 63-150848

[51] Int. Cl.$^5$ ........................ H03K 19/094
[52] U.S. Cl. .................. 307/451; 307/443; 307/263
[58] Field of Search ........... 307/263, 443, 451, 475

[56] References Cited

U.S. PATENT DOCUMENTS

| | | | |
|---|---|---|---|
| 4,490,627 | 12/1984 | Moench et al. | 307/290 |
| 4,638,187 | 1/1987 | Boler et al. | 307/451 |
| 4,649,295 | 3/1987 | McLaughlin et al. | 307/451 |
| 4,687,954 | 8/1987 | Yasuda et al. | 307/451 |
| 4,731,553 | 3/1988 | Van Lehn et al. | 307/579 |
| 4,739,193 | 4/1988 | Doty, II | 307/263 |
| 4,749,882 | 7/1988 | Morgan | 307/451 |
| 4,779,013 | 10/1988 | Tanaka | 307/451 |
| 4,785,203 | 11/1988 | Nakamura | 307/451 |
| 4,818,901 | 4/1989 | Young et al. | 307/263 |
| 4,820,942 | 4/1989 | Chan | 307/473 |
| 4,829,199 | 5/1989 | Prater | 307/451 |
| 4,857,770 | 8/1989 | Partovi et al. | 307/451 |
| 4,893,029 | 1/1990 | Matsuo et al. | 307/443 |

FOREIGN PATENT DOCUMENTS 0212584 3/1987 European Pat. Off. .
0251910 1/1988 European Pat. Off. .
61-292412 12/1986 Japan .

OTHER PUBLICATIONS

IBM Disc. Bult., "Low L di/dt Noise Off-Chip Driver", Feb. '88, vol. 30, No. 9, pp. 174-174.

Primary Examiner—Stanley D. Miller
Assistant Examiner—Terry D. Cunningham
Attorney, Agent, or Firm—Armstrong, Nikaido, Marmelstein, Kubovcik & Murray

[57] ABSTRACT

A semiconductor integrated circuit having a complementary metal oxide semiconductor (CMOS) inverter includes a CMOS inverter circuit and a noise reduction circuit. The CMOS inverter has input and output terminals, and inverts an input signal applied to the input terminal to thereby output an output signal through the output terminal. The noise reduction circuit, which is connected to the CMOS inverter, rapidly passes a current supplied from the CMOS inverter to the low-potential power source until a potential of the output terminal decreases to a predetermined potential in response to an increase in potential of the input signal, and slowly passes the current after the potential of the output terminal reaches the predetermined potential.

10 Claims, 5 Drawing Sheets

FIG.1(a) INPUT SIGNAL 
FIG.1(b) OUTPUT WAVEFORM 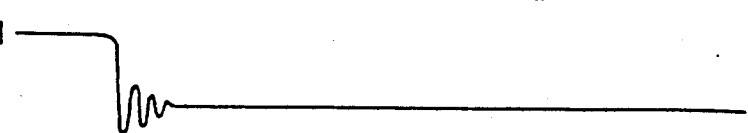
FIG.1(c) GND 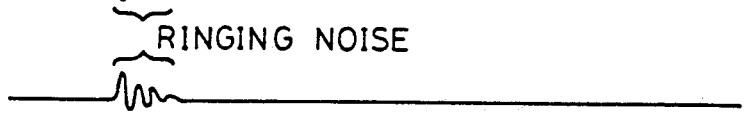
RINGING NOISE
FIG 2
PRIOR ART
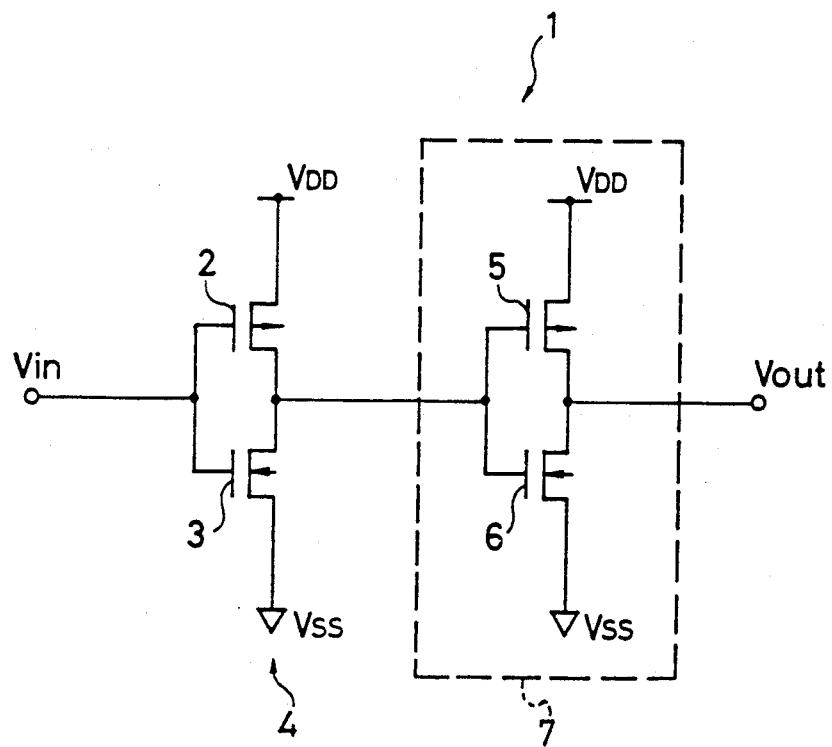

CMOS INVERTER WITH NOISE REDUCTION FEEDBACK MEANS

BACKGROUND OF THE INVENTION

The present invention generally relates to a semiconductor integrated circuit having a CMOS (complementary metal oxide semiconductor) inverter, and particularly to the suppression of a ringing noise which causes a malfunction of a semiconductor integrated circuit having a CMOS inverter.

Currently, there is a trend on increase in the integration level and operational speed of a CMOS transistor circuit. Additionally, a high-speed or high mutal transconductance CMOS buffer becomes available. Such a CMOS buffer is frequently used to form an output buffer. As is well known, a ringing noise is a serious problem which frequently occurs in a high-speed or high-driveability CMOS output buffer. Particularly, a ringing noise causes a level inversion when an output signal of a circuit having a CMOS inverter falls.

Referring to FIG. 1, a ringing noise is interposed on an output waveform (b) of a CMOS inverter when an input signal (a) is applied thereto. As is illustrated, the output waveform alternately changes due to the presence of the ringing noise. Generally, the low threshold potential of a CMOS inverter is set equal to approximately 1.5 volts, when a TTL interface is used. Alternatively, the low threshold potential is set equal to approximately 2.5 volts, when a high-potential power source voltage $V_{DD}$ is set equal to 5 volts and a low-potential power source voltage $V_{SS}$ is set equal to 0 volt. Therefore, when the output signal falls, the level of the output signal may be alternately inverted. Also, the potential (c) of a ground terminal (a $V_{SS}$ terminal) of the CMOS buffer changes depending on the change of the output waveform. If a ringing noise is introduced into a bus, for example, it may affect an internal circuit formed in an LSI circuit and causes a malfunction thereof. The reason why ringing frequently occurs in a CMOS circuit is as follows. First, the output waveform changes in a full swing of the power source voltage, between 5 volts to 0 volt, for example. Secondly, a current passes through the CMOS inverter at a dash, and additionally there is no branch path through which the current passes. Particularly, the occurrence of ringing noises described above is a serious problem in aiming to increase the operational speed of MOS transistors.

FIG. 2 illustrates a conventional CMOS output buffer provided with no measurement to count a ringing noise. An output buffer 1 consists of two cascaded CMOS inverters 4 and 7. The CMOS inverter 4 is made up of a P-channel MOS transistor (hereinafter simply referred to as a PMOS transistor) 2 and an N-channel MOS transistor (hereinafter simply referred to as an NMOS transistor) 3. Similarly, the CMOS inverter 7 is made up of a PMOS transistor 5 and an NMOS transistor 6. A variation in the output signal supplied from the output buffer 1 as a function of time is illustrated by a broken line shown in FIG. 5. It can be seen from FIG. 5 that the output signal decreases to ground level rapidly. This rapid decrease of the output signal causes a ringing noise.

FIG. 3 illustrates a configuration of a conventional low-noise type CMOS output buffer 8 equipped with a ringing noise reduction circuit. An input signal Vin is applied to input inverters 9 and 10. The input inverter 9 is made up of a PMOS transistor 11, and NMOS transistors 12 through 15. The gates of the NMOS transistor 13 through 15 connected in series are connected to a high-potential power source $V_{DD}$. The source of the NMOS transistor 15 is connected to a low-potential power source $V_{SS}$. The input inverter 10 is made up of PMOS transistors 16, and 18 through 20, and an NMOS transistor 17. The gates of the PMOS transistors 18 through 20 connected in series are connected to the low-potential power source $V_{SS}$. The source of the NMOS transistor 17 is connected to the low-potential power source $V_{SS}$. The source of the PMOS transistor 18 is connected to the high-potential power source $V_{DD}$. The output signal of the input inverter 9 is supplied to the gate of a PMOS transistor 22, which is a part of an output inverter 21. The output signal of the input inverter 10 is supplied to the gate of an NMOS transistor 23, which is another part of the output inverter 21.

The potential of the source of the NMOS transistor 12 is pulled up to a potential $V_{SS'}$, due to the presence of the NMOS transistors 13 through 15 ($V_{SS'} > V_{SS}$). The potential of the drain of the PMOS transistor 16 is pulled down to a potential $V_{DD'}$, due to the presence of the PMOS transistors 18 through 20 ($V_{DD} > V_{DD'}$). Therefore, when the input signal Vin is changed from "L (low level)" to "H" (high level)", the NMOS transistor 12 is not turned ON until the NMOS transistor 12 is supplied with a threshold voltage higher than a normal threshold voltage obtained in case where the CMOS inverter 9 consists of the PMOS and NMOS transistors 11 and 12. This is because the threshold voltage of the NMOS transistor 12 is set so as to be shifted toward the $V_{DD}$ level. Thereafter, when the input signal Vin exceeds the threshold voltage of the NMOS transistor 12 which is higher than the normal threshold voltage, the NMOS transistor 12 is turned ON and the PMOS transistor 11 is turned OFF. Then the gate of the PMOS transistor 22 becomes equal to the potential $V_{SS'}$, and thus the PMOS transistor 22 is turned ON. As a result, an output signal Vout becomes equal to the potential $V_{DD}$.

On the other hand, when the input signal Vin is changed from "H" to "L", the PMOS transistor 16 is not turned ON until the PMOS transistor 16 is supplied with a threshold voltage lower than a normal threshold voltage obtained in case where the CMOS inverter 10 consists of the PMOS and NMOS transistors 16 and 17. Then when the input signal Vin becomes equal to the threshold voltage of the PMOS transistor 16 which is lower than the normal threshold voltage, the PMOS transistor 16 is turned ON and the NMOS transistor 17 is turned OFF. Therefore, the gate of the NMOS transistor 23 becomes equal to the potential $V_{DD'}$. As a result, the output signal Vout becomes the potential $V_{SS}$. In this manner, the improvement of FIG. 3 reduces a time during which both the PMOS and NMOS transistors 22 and 23 are ON, and thereby reduces a through current passing therethrough. The waveform of the output signal Vout at the output inverter 21 is illustrated as a solid line C1 shown in FIG. 5. It can be seen from FIG. 5 that the output signal available in the output buffer 8 decreases slowly, compared with the output signal available in the output buffer 1 shown in FIG. 2.

However, the output buffer 8 having the conventional ringing noise reduction circuit shown in FIG. 3 has the following disadvantages to be overcome. As described above, the ringing noise is reduced by slowly decreasing the output signal Vout as indicated by the curve C1. However, the above causes an increase of the response time of the output signal Vout, and thus prevents the output buffer 8 from operating with high speeds. In other words, the output buffer 8 does not satisfy high-speed operation and small ringing noise at the same time.

SUMMARY OF THE INVENTION

It is therefore a general object of the present invention to provide an improved semiconductor integrated circuit having a CMOS inverter in which the above-mentioned disadvantages of the conventional circuit are eliminated.

A more specific object of the present invention is to provide a semiconductor integrated circuit having a CMOS inverter which can operate at high speeds with extremely reduced ringing noise.

The above objects of the present invention can be achieved by a semiconductor integrated circuit having a complementary metal oxide semiconductor (CMOS) inverter that includes a CMOS inverter circuit and a noise reduction circuit. The CMOS inverter has input and output terminals and inverts an input signal applied to the input terminal to thereby output an output signal through the output terminal. The noise reduction circuit, which is connected to the CMOS inverter, rapidly passes a current supplied from the CMOS inverter to the low-potential power source until a potential of the output terminal decreases to a predetermined potential in response to an increase in potential of the input signal, and slowly passes the current after the potential of the output terminal reaches the predetermined potential.

The above-mentioned objects of the present invention can also be achieved by a semiconductor integrated circuit having a complementary metal oxide semiconductor (CMOS) inverter, comprising a CMOS inverter including a first P-channel MOS transistor having a drain, source and gate, and a first N-channel MOS transistor having a drain, source and gate. The source of the first P-channel MOS transistor is connected to a high-potential power source and forms an output of the circuit. The gates of the first P-channel and N-channel MOS transistors are mutually connected and supplied with an input signal. The circuit also includes a second N-channel MOS transistor having a drain, source and gate. The drain of the second N-channel MOS transistor is connected to the source of the first N-channel MOS transistor. The source of the second N-channel MOS transistor is connected to a low-potential power source. The gate of the second N-channel MOS transistor is connected to the gates of the first P-channel and N-channel MOS transistors. Further, the circuit includes a third N-channel MOS transistor having a drain, source and gate. The drain of the third N-channel MOS transistor is connected to the source of the first N-channel MOS transistor. The source of the third N-channel MOS transistor is connected to the low-potential power source. The gate of the third N-channel MOS transistor is connected to the output of the circuit.

Other objects, features and advantages of the present invention will become apparent from the following detailed description when read in conjunction with the accompanying drawings.

BRIEF DESCRIPTION OF THE DRAWINGS

FIG. 1A–1C are a waveform diagram illustrating a ringing noise which occurs in a CMOS buffer;

FIG. 2 is a circuit diagram of a conventional CMOS buffer which is provided with no measurement to count a ringing noise;

DESCRIPTION OF THE PREFERRED EMBODIMENT

Figure 3:
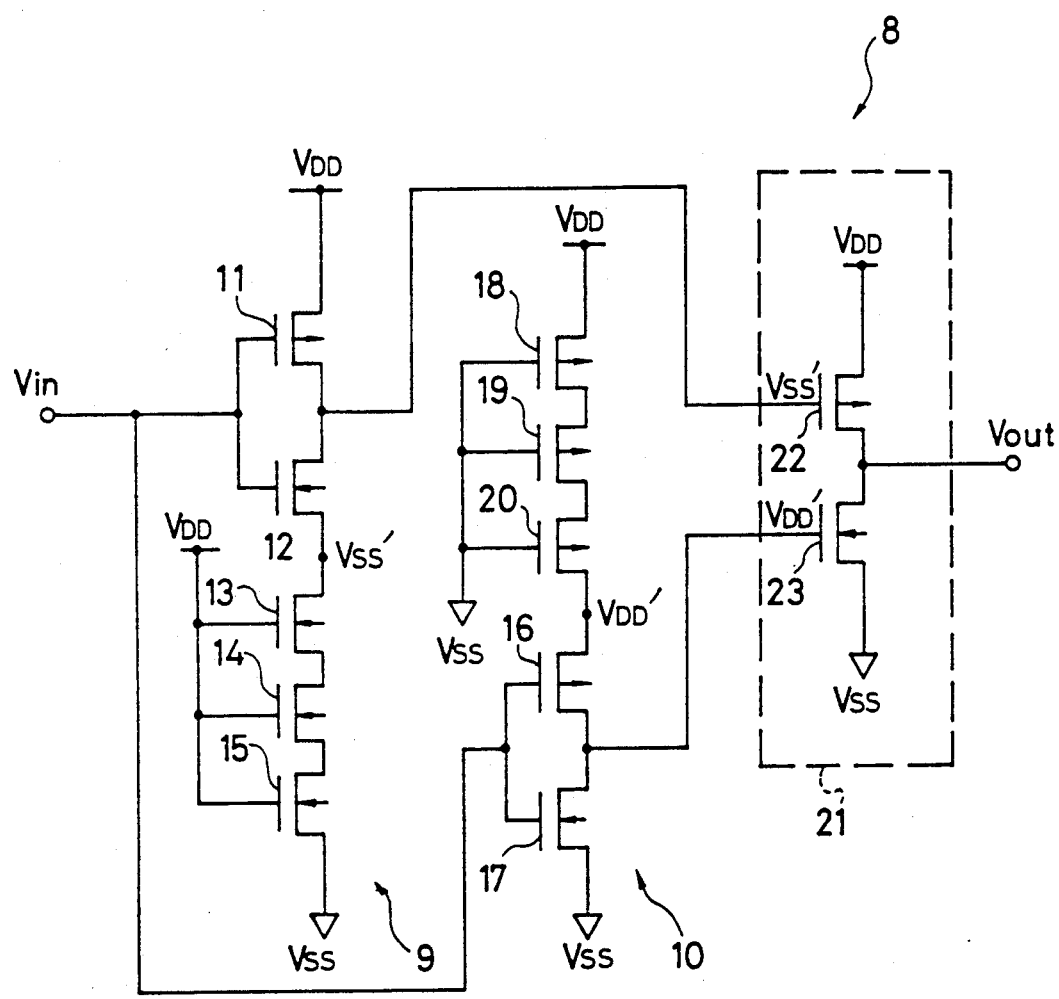
FIG. 3 is a circuit of a conventional CMOS buffer equipped with a ringing noise reduction circuit.
Figure 4:
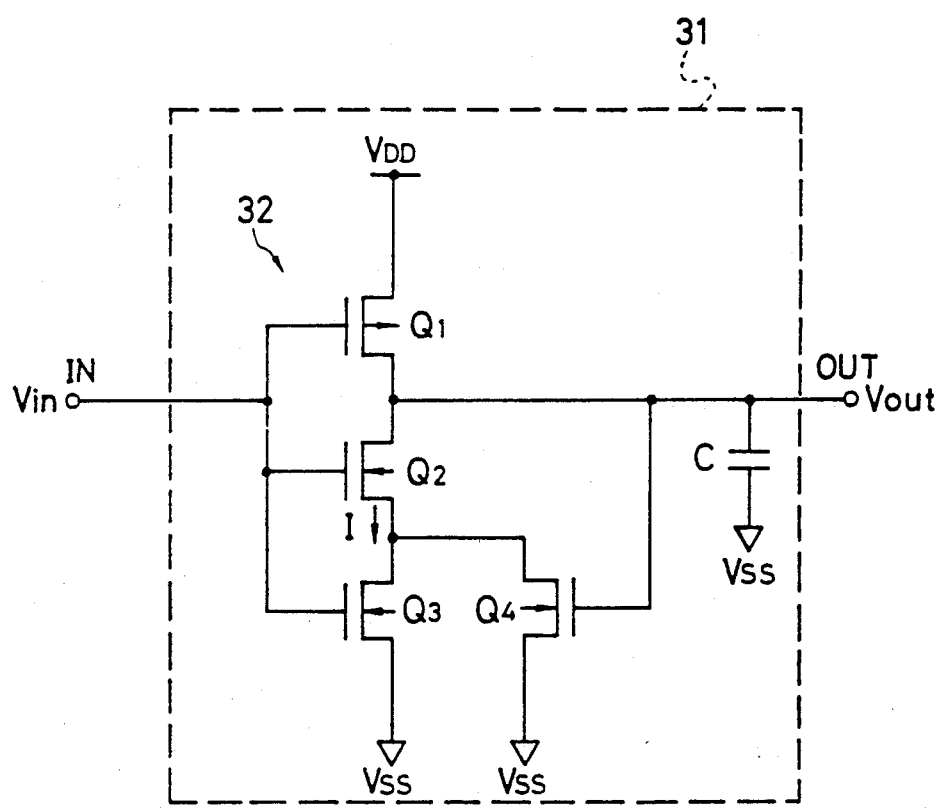
FIG. 4 is a circuit diagram of a preferred embodiment of the present invention.

A description is given of a preferred embodiment with reference to FIG. 4. Referring to FIG. 4, there is illustrated a CMOS buffer 31 which includes a CMOS inverter equipped with a ringing noise reduction circuit. The CMOS buffer 31 functions as a CMOS output buffer, and includes a PMOS transistor Q1 and NMOS transistors Q2, Q3 and Q4. The combination of the PMOS and NMOS transistors Q1 and Q2 forms an inverter 32. The source of the PMOS transistor Q1 is connected to the high-potential power source $V_{DD}$. The drains of the PMOS and NMOS transistors Q1 and Q2 are mutually connected. The combination of the NMOS transistors Q3 and Q4 is served as a ringing noise reduction circuit. The source of the NMOS transistor Q2 is connected to the drains of the NMOS transistors Q3 and Q4. The gates of the PMOS transistor Q1 and the NMOS transistors Q2 and Q3 are mutually connected, and provided with the input signal Vin through an input terminal IN. The gate of the NMOS transistor Q4 is connected to the drains of the PMOS and NMOS transistors Q1 and Q2, which are also connected to an output terminal OUT. The sources of the NMOS transistors Q3 and Q4 are connected to the low-potential power source $V_{SS}$. A capacitor C indicates a capacitance formed by elements coupled to the output terminal OUT, such as a transistor and a line.

In operation, when the input signal Vin is switched from "L" level to "H" level, the NMOS transistors Q2 and Q3 go toward the ON state. At this time, a current I from the high-potential power source $V_{DD}$ through the NMOS transistor Q2 passes through the NMOS transistors Q3 and Q4. Then the output signal Vout is changed to "L" level. The NMOS transistors Q2 and Q3 are maintained in the ON state so long as the input signal Vin is at "H" level. The current I is intended to pass through the NMOS transistors Q2 through Q4 until the output signal Vout becomes equal to ground level. However, the NMOS transistor Q4 is turned OFF, when the output signal Vout decreases and then reaches the logical threshold level of the NMOS transistor Q4. Therefore, when the output signal Vout is lower than the logical threshold level of the NMOS transistor Q4, the current I from the NMOS transistor Q2 passes through only the NMOS transistor Q3. As a result, the output signal Vout slowly decreases toward ground level after reaching the logical threshold level of the NMOS transistor Q4. In other words, the waveform of the output signal Vout becomes dull.

It is noted that if the NMOS transistor Q2 has the same size as the NMOS transistor 6 or 23, the ON resistance of the N-channel circuit portion consisting of the NMOS transistors Q2 to Q4 is larger than that obtained in case where the N-channel circuit portion consists of only the NMOS transistor Q2. In this case, the logic threshold level of the CMOS buffer 31 is larger than that for the conventional circuit 7 or 21. In order to obtain the logic threshold level of the CMOS buffer 31 almost identical to that for the conventional inverter, the NMOS transistor Q2 is formed by a transistor having the size larger than a transistor used for forming the NMOS transistor 6 or 23.

Additionally, it is possible to adjust the decreasing speed of the output signal Vout by changing the size of the NMOS transistors Q2, Q3 and Q4. For example, the NMOS transistors Q2 and Q4 are formed by large-size NMOS transistors (having a large value of the mutual conductance), and the NMOS transistor Q3 is formed by a small-size NMOS transistor (having a small value of the mutual conductance). Therefore, it is possible to rapidly decrease the output signal Vout to a low potential which is close to and higher than the logical threshold voltage of the NMOS transistor Q4 (approximately 0.65 volts, for example) and thereafter decrease the output signal Vout slowly. As a result, an ideal waveform of the output signal Vout is available.

Figure 5:
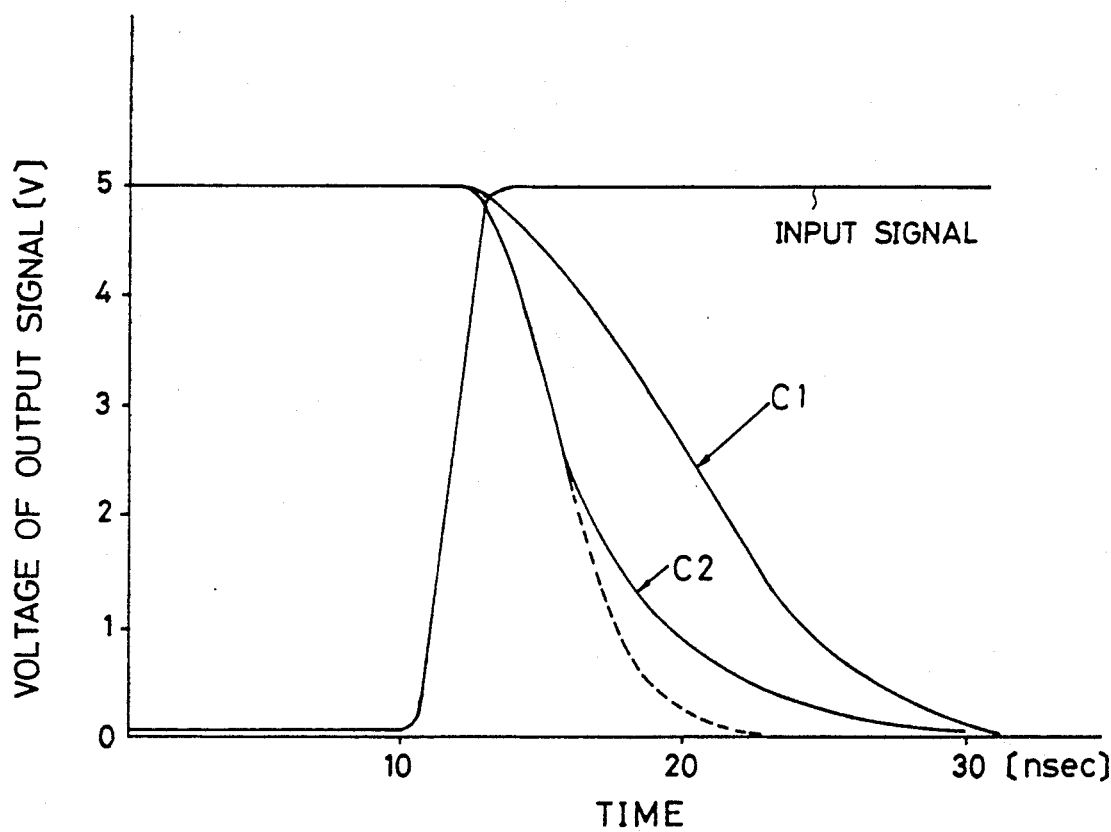
FIG. 5 is a waveform diagram illustrating the time-variation of output waveforms observed in the conventional circuits of FIGS. 2 and 3 and the preferred embodiment shown in FIG. 4.

The waveform of the output signal Vout is indicated by a solid line C2 shown in FIG. 5. It can be seen from FIG. 5 that the waveform of the output signal Vout indicated by the curve C2 satisfies high-speed operation and reduction of a ringing noise at the same time.

Figure 6:
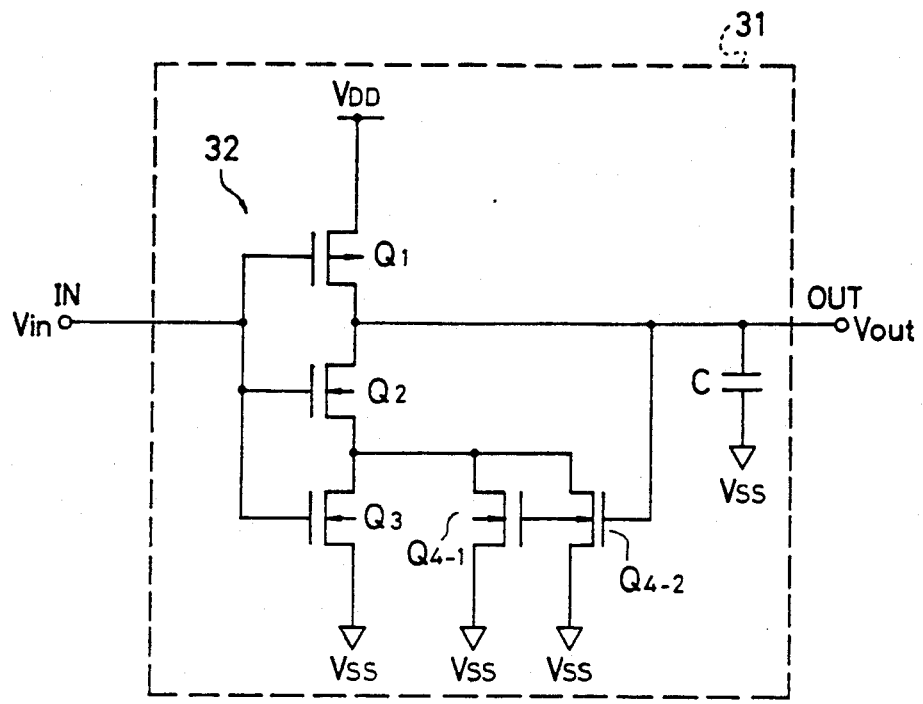
FIG. 6 is a circuit diagram of a variation of the circuit shown in FIG. 4.

FIG. 6 is a variation of the CMOS buffer 31. An essential feature of this variation is that the NMOS transistor Q4 is made up of two NMOS transistors Q4-1 and Q4-2 connected in parallel. The variation contributes to speeding up the operation of the CMOS buffer 31.

Figure 7:
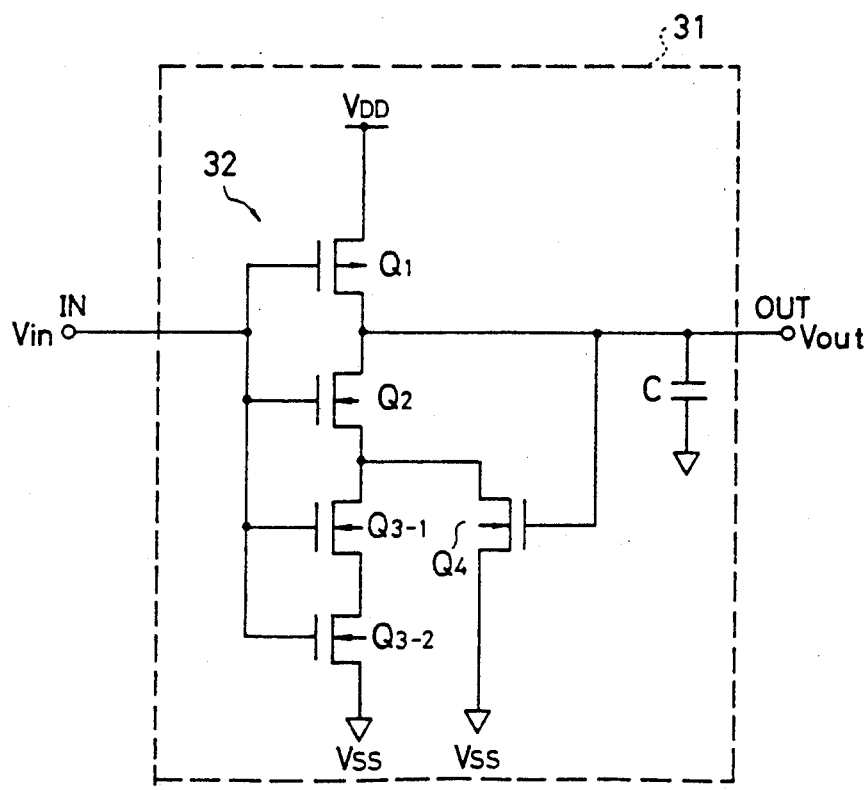
FIG. 7 is a circuit diagram of another variation of the circuit shown in FIG. 4.

FIG. 7 is another variation of the CMOS buffer 31. An essential feature of this variation is that the NMOS transistor Q3 is made up of two NMOS transistors Q3-1 and Q3-2 connected in series. The variation of FIG. 7 also contributes to speeding up the circuit operation. In the variations of FIGS. 6 and 7, it is also possible to use three or more NMOS transistors to form the NMOS transistor Q3 and/or Q4.

A ringing noise also occurs when the input signal Vin decreases from "H" level to "L" level. However, such a ringing noise may not cause a serious problem such as level inversion.

The present invention is not limited to the aforementioned embodiment, and variations and modifications may be made without departing from the scope of the present invention.

What is claimed is:

1. A semiconductor integrated circuit comprising:
a first MOS transistor coupled between a first power supply line and an output node of the semiconductor integrated circuit, said first MOS transistor having a first channel type;
a second MOS transistor coupled between the output node and a first intermediate node, said second MOS transistor having a second channel type;
a third MOS transistor coupled between the first intermediate node and a second power supply line, said third MOS transistor having the second channel type; and
a fourth MOS transistor coupled between the first intermediate node and the second power supply line, said fourth MOS transistor having the second channel type, wherein gate electrodes of said first, second and third MOS transistors being commonly coupled to an input node of the semiconductor integrated circuit, and
a gate electrode of said fourth MOS transistor being coupled to the output node.

2. A semiconductor integrated circuit as claimed in claim 1, further comprising
a fifth MOS transistor coupled between said third MOS transistor and the second power supply line, and a gate of said fifth MOS transistor being coupled to the input node, and further said fifth MOS transistor having the second channel type.

3. A semiconductor integrated circuit as claimed in claim 1, further comprising:
a fifth MOS transistor coupled between the first intermediate node and the second power supply line, a gate electrode of said fifth MOS transistor and the gate of said fourth MOS transistor being coupled to the output node, and said fifth MOS transistor having the second channel type.

4. A semiconductor integrated circuit as claimed in claim 1, wherein said second MOS transistor has a mutual transconductance higher than that of said first MOS transistor.

5. A semiconductor integrated circuit as claimed in claim 1, wherein said second MOS transistor has a mutual transconductance higher than that of said first MOS transistor.

6. A semiconductor integrated circuit device as claimed in claim 1, wherein said circuit forms an output buffer.

7. A semiconductor integrated circuit having a complementary metal oxide semiconductor (CMOS) inverter device, comprising:
a CMOS inverter including a first P-channel MOS transistor having a drain, source and gate, and a first N-channel MOS transistor having a drain, source and gate, the source of said first P-channel MOS transistor being connected to a high-potential power source the drains of said first P- and N-channel MOS transistors being connected together and forming an output of said circuit, and the gates of said first P-channel and N-channel MOS transistors being mutually connected and supplied with an input signal;
a second N-channel MOS transistor having a drain, source and gate, the drain of said second N-channel MOS transistor being connected to the source of said first N-channel MOS transistor, the source of said P-channel MOS transistor being connected to a low-potential power source, the gate of said second N-channel MOS transistor being connected to the gates of said first P-channel and N-channel MOS transistors; and
a third N-channel MOS transistor having a drain, source and gate, the drain of said third N-channel MOS transistor being connected to the source of said first N-channel MOS transistor, the source of said third N-channel MOS transistor being connected to said low-potential power source, the gate of said third N-channel MOS transistor being connected to said output of the circuit.

8. A semiconductor integrated circuit as claimed in claim 7, wherein said third N-channel MOS transistor has a mutal transconductance higher than that of said second N-channel MOS transistor.

9. A semiconductor integrated circuit as claimed in claim 7, wherein said first N-channel MOS transistor has a mutal transconductance higher than that of said second N-channel MOS transistor.

10. A semiconductor integrated circuit as claimed in claim 7, wherein said second and third N-channel MOS transistors reduce ringing noise.

* * * * *

UNITED STATES PATENT AND TRADEMARK OFFICE
CERTIFICATE OF CORRECTION

PATENT NO. : 5,073,727
DATED : December 17, 1991
INVENTOR(S) : SHIZU

It is certified that error appears in the above-identified patent and that said Letters Patent is hereby corrected as shown below:

On the cover page, please add item [73], --FUJITSU LIMITED, Kawasaki-shi, Japan and FUJITSU VLSI LIMITED, Kasugai-shi, Japan--.

Signed and Sealed this

Thirteenth Day of July, 1993

Attest:

MICHAEL K. KIRK

Attesting Officer

Acting Commissioner of Patents and Trademarks